United States Patent
Tsai

(10) Patent No.: US 8,125,814 B2
(45) Date of Patent: Feb. 28, 2012

(54) MAGNETIC MEMORY, DRIVING METHOD THEREOF, AND MANUFACTURING METHOD THEREOF

(75) Inventor: Ching-Hsiang Tsai, Kaohsiung (TW)

(73) Assignee: Industrial Technology Research Institute, Hsinchu (TW)

(*) Notice: Subject to any disclaimer, the term of this patent is extended or adjusted under 35 U.S.C. 154(b) by 452 days.

(21) Appl. No.: 12/390,513

(22) Filed: Feb. 23, 2009

(65) Prior Publication Data

US 2010/0135058 A1 Jun. 3, 2010

(30) Foreign Application Priority Data

Dec. 1, 2008 (TW) ................................ 97146625 A

(51) Int. Cl.
*G11C 19/00* (2006.01)

(52) U.S. Cl. ............... 365/80; 365/158; 438/3; 257/421

(58) Field of Classification Search .............. 365/80, 365/158; 438/3; 257/421
See application file for complete search history.

(56) References Cited

U.S. PATENT DOCUMENTS

| | | | |
|---|---|---|---|
| 6,834,005 B1 | 12/2004 | Parkin | |
| 6,898,132 B2 | 5/2005 | Parkin | |
| 6,920,062 B2* | 7/2005 | Parkin | 365/158 |
| 7,031,178 B2* | 4/2006 | Parkin | 365/80 |
| 7,108,797 B2* | 9/2006 | Chen et al. | 216/22 |
| 7,236,386 B2 | 6/2007 | Parkin | |
| 7,492,622 B2* | 2/2009 | Parkin et al. | 365/80 |
| 7,598,097 B2* | 10/2009 | Chen et al. | 438/3 |
| 7,760,535 B2* | 7/2010 | Parkin et al. | 365/81 |

OTHER PUBLICATIONS

L. Thomas et al., "Oscillatory dependence of current-driven magnetic domain wall motion on current pulse length." Nature, vol. 443, pp. 197-200, Sep. 14, 2006.
E. Martinez et al. "Resonant domain wall depinning induced by oscillating spin-polarized currents in thin ferromagnetic strips," Physical Review B 77, 144417, 2008.

* cited by examiner

*Primary Examiner* — Tuan T Nguyen
*Assistant Examiner* — Toan Le
(74) *Attorney, Agent, or Firm* — Jianq Chyun IP Office

(57) ABSTRACT

A magnetic memory, a driving method thereof, and a manufacturing method thereof are provided. The magnetic memory includes a plurality of lead structures, a plurality of first magnetic metal structures, a second magnetic metal structure, and an insulation layer. Each of the first magnetic metal structures is disposed between adjacent two of the lead structures, and the second magnetic metal structure spans over the lead structures. A structure composed of the first magnetic metal structures and the second magnetic metal structure includes a plurality of magnetic memory cells connected with each other. Each of the magnetic memory cells has a magnetic domain and a domain wall adjacent to the magnetic domain, wherein the magnetic domain is suitable for storing a bit data.

37 Claims, 16 Drawing Sheets

MAGNETIC MEMORY, DRIVING METHOD THEREOF, AND MANUFACTURING METHOD THEREOF

CROSS-REFERENCE TO RELATED APPLICATION

This application claims the priority benefit of Taiwan application serial no. 97146625, filed on Dec. 1, 2008. The entirety of the above-mentioned patent application is hereby incorporated by reference herein and made a part of specification.

BACKGROUND OF THE INVENTION

1. Field of the Invention

The present invention generally relates to a memory, a driving method thereof, and a manufacturing method thereof, and more particularly, to a magnetic memory, a driving method thereof, and a manufacturing method thereof.

2. Description of Related Art

FIG. 1 is a partial view of a conventional magnetic memory disclosed in U.S. Pat. No. 6,834,005. Referring to FIG. 1, the magnetic memory 100 includes a substrate 110, a magnetic metal track 120, a read device 130, and a write device 140. The magnetic metal track 120 includes a plurality of magnetic memory cells 122 connected with each other, and each of the magnetic memory cells 122 includes a memory portion 122M and a notch portion 122W. Generally speaking, the notch portions 122W are periodically arranged in the magnetic memory 100 to define the positions and sizes of the memory portions 122M.

Based on the structure described above and the physical characteristic of the magnetic metal track 120 itself, the magnetic metal track 120 can be used for recording bit data, wherein the memory portions 122M are used for recording the bit data of "0" or "1", and the notch portions 122W are used for separating the bit data recorded in adjacent memory portions 122M. As shown in FIG. 1, the bit data of "0" or "1" is defined in each of the memory portions 122M according to a magnetic moment direction D in the area of the memory portion 122M, wherein the area of the memory portion 122M is usually referred to as a magnetic domain. On the other hand, because the magnetic moment direction (not shown) in the area of each of the notch portions 122W is different from the magnetic moment directions D in the areas of the adjacent two memory portions 122M, the bit data recorded in the adjacent two magnetic domains can be separated by the notch portion 122W, wherein the area of the notch portion 122W is usually referred to as a domain wall. As shown in FIG. 1, the memory portion 122M (the magnetic domain) and the notch portion 122W (the domain wall) in each of the magnetic memory cells 122 are adjacent to each other.

However, the notch portions 122W are very difficult to be fabricated and the process window thereof is very low. Accordingly, the fabrication yield of the periodically arranged notch portions 122W cannot be improved.

Conventionally, the bit data recorded in the magnetic memory cells 122 is read by using the read device 130, and new bit data is written into the magnetic memory cells 122 by using the write device 140. However, herein the term "write" does not mean that the magnetic memory cell 122 will record two bit data after the new bit data is written into the magnetic memory cell 122; instead, it means that the original bit data in the magnetic memory cell 122 is "updated".

The write device 140 changes the magnetic moment direction D of the memory portion 122M located above the write device 140 by using a magnetic leakage field 141. Thus, the bit data in the memory portion 122M has to be located above the write device 140 in order to allow the write device 140 to write data, wherein the bit data is shifted out of or into the memory portion 122M by a high current pulse HP received by the magnetic metal track 120. To be specific, during an shift period, a high current pulse HP is supplied to the magnetic metal track 120. In this case, the bit data is shifted out of the current memory portion 122M and into the adjacent memory portion 122M by the high current pulse HP. In other words, during the shift period, the bit data in each of the memory portions 122M is pushed into a next or a previous memory portion 122M by the high current pulse HP, wherein the shifting direction of the bit data is determined by the high current pulse HP. A read/write period is entered after the shift period, and herein each bit data remains in the memory portion 122M so that the write device 140 can write new bit data into the memory portion 122M located above the write device 140. Similarly, the read device 130 can read the bit data from the memory portion 122M located above the read device 130 during the read/write period; however, the operation details will not be described herein.

Generally, a high current pulse HP between $10^7$ amp/cm2 and $10^8$ amp/cm2 or even higher is required to shift a bit data out of or into a memory portion 122M. However, such an electrical parameter increases the power consumption of the magnetic memory 100.

SUMMARY OF THE INVENTION

Accordingly, the present invention is directed to a magnetic memory with low power consumption.

The present invention is also directed to a driving method of a magnetic memory, wherein the magnetic memory is driven by using a low current pulse.

The present invention is further directed to a manufacturing method of a magnetic memory, wherein the complexity and difficulty in manufacturing the magnetic memory are reduced.

The present invention is still directed to a manufacturing method of a magnetic memory, wherein a high process yield is offered.

The present invention provides a magnetic memory including a plurality of lead structures, a plurality of first magnetic metal structures, a second magnetic metal structure, and an insulation layer. The lead structures are disposed on a substrate and do not intersect each other. The first magnetic metal structures are disposed on the substrate, and each of the first magnetic metal structures is respectively between adjacent two of the lead structures. The second magnetic metal structure is disposed on the substrate, and the second magnetic metal structure covers the lead structures and the first magnetic metal structures and spans over the lead structures. In addition, a structure composed of the first magnetic metal structures and the second magnetic metal structure includes a plurality of magnetic memory cells connected with each other. Each of the magnetic memory cells has a magnetic domain and a domain wall adjacent to the magnetic domain, wherein the magnetic domain is suitable for storing a bit data. The insulation layer is disposed between the lead structures and the first magnetic metal structures and between the lead structures and the second magnetic metal structure.

The present invention also provides a driving method of foregoing magnetic memory. The driving method includes following steps. During a shift period, an alternating current (AC) signal is provided to the lead structures. During the shift period, a low current pulse is provided to the second magnetic metal structure to shift the bit data in each of the magnetic memory cells out of or into the magnetic domain.

The present invention further provides a manufacturing method of a magnetic memory. The manufacturing method includes following steps. First, a plurality of lead structures is formed on a substrate, wherein the lead structures do not intersect each other. Then, an insulation layer is formed on the substrate, wherein the insulation layer covers the lead structures. Next, a plurality of first magnetic metal structures is formed on the insulation layer, wherein each of the first magnetic metal structures is respectively disposed between adjacent two of the lead structures. After that, a magnetization process is performed to the first magnetic metal structures so that a magnetic coupling force direction is generated by the first magnetic metal structures. Thereafter, a second magnetic metal structure is formed on the insulation layer, wherein the second magnetic metal structure covers the first magnetic metal structures and spans over the lead structures. The extension direction of the second magnetic metal structure is different from the magnetic coupling force direction. In addition, a structure, composed of the first magnetic metal structures and the second magnetic metal structure is divided into a plurality of magnetic memory cells connected with each other through the dispositions of the lead structures, wherein each of the magnetic memory cells has a magnetic domain and a domain wall adjacent to the magnetic domain.

The present invention still provides a manufacturing method of a magnetic memory. The manufacturing method includes following steps. First, a plurality of lead structures is formed on a substrate, wherein the lead structures do not intersect each other. Then, an insulation layer is formed on the substrate, wherein the insulation layer covers the lead structures. Next, a magnetic metal structure is formed on the insulation layer, wherein the magnetic metal structure spans over the lead structures. Besides, the magnetic metal structure is divided into a plurality of magnetic memory cells connected with each other through the dispositions of the lead structures, wherein each of the magnetic memory cells has a magnetic domain and a domain wall adjacent to the magnetic domain.

According to the present invention, a plurality of lead structures is disposed in a magnetic memory so that the power consumption of the magnetic memory is reduced and the complexity and difficulty in manufacturing the magnetic memory are also reduced. In other words, a driving method of the magnetic memory provided by the present invention reduces the power consumption of the magnetic memory, and a manufacturing method of the magnetic memory provided by the present invention effectively increases the process yield of the magnetic memory.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 6B' is a partial perspective cross-sectional view of a substrate, lead structures, and an insulation layer in a magnetic memory according to the first embodiment of the present invention.

FIG. 8B' is a partial perspective cross-sectional view of a substrate, lead structures, and an insulation layer in a magnetic memory according to the second embodiment of the present invention.

DESCRIPTION OF THE EMBODIMENTS

Figure 1:
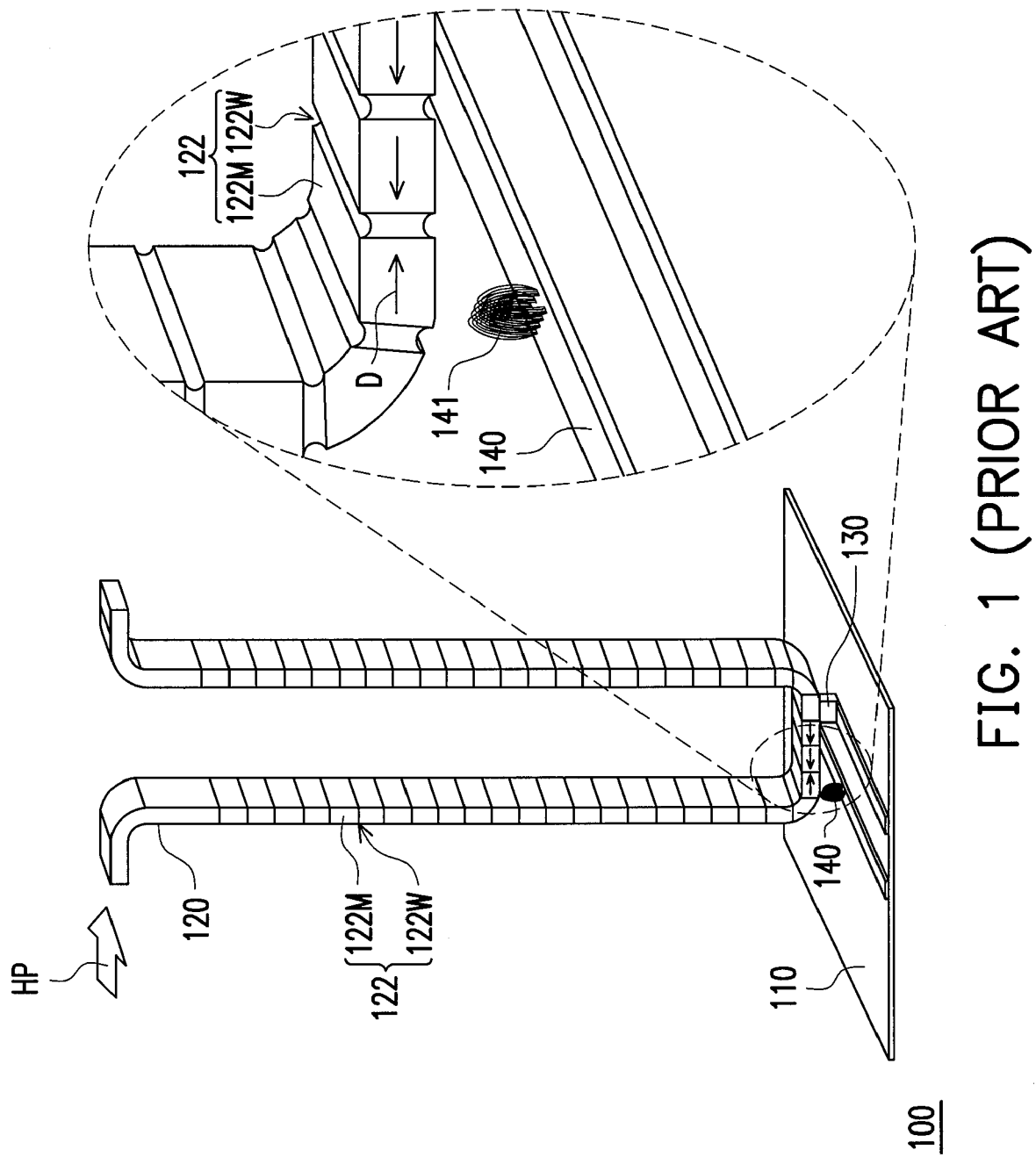
FIG. 1 is a partial view of a conventional magnetic memory.

Reference will now be made in detail to the present preferred embodiments of the invention, examples of which are illustrated in the accompanying drawings. Wherever possible, the same reference numbers are used in the drawings and the description to refer to the same or like parts.

First Embodiment

Figure 2:
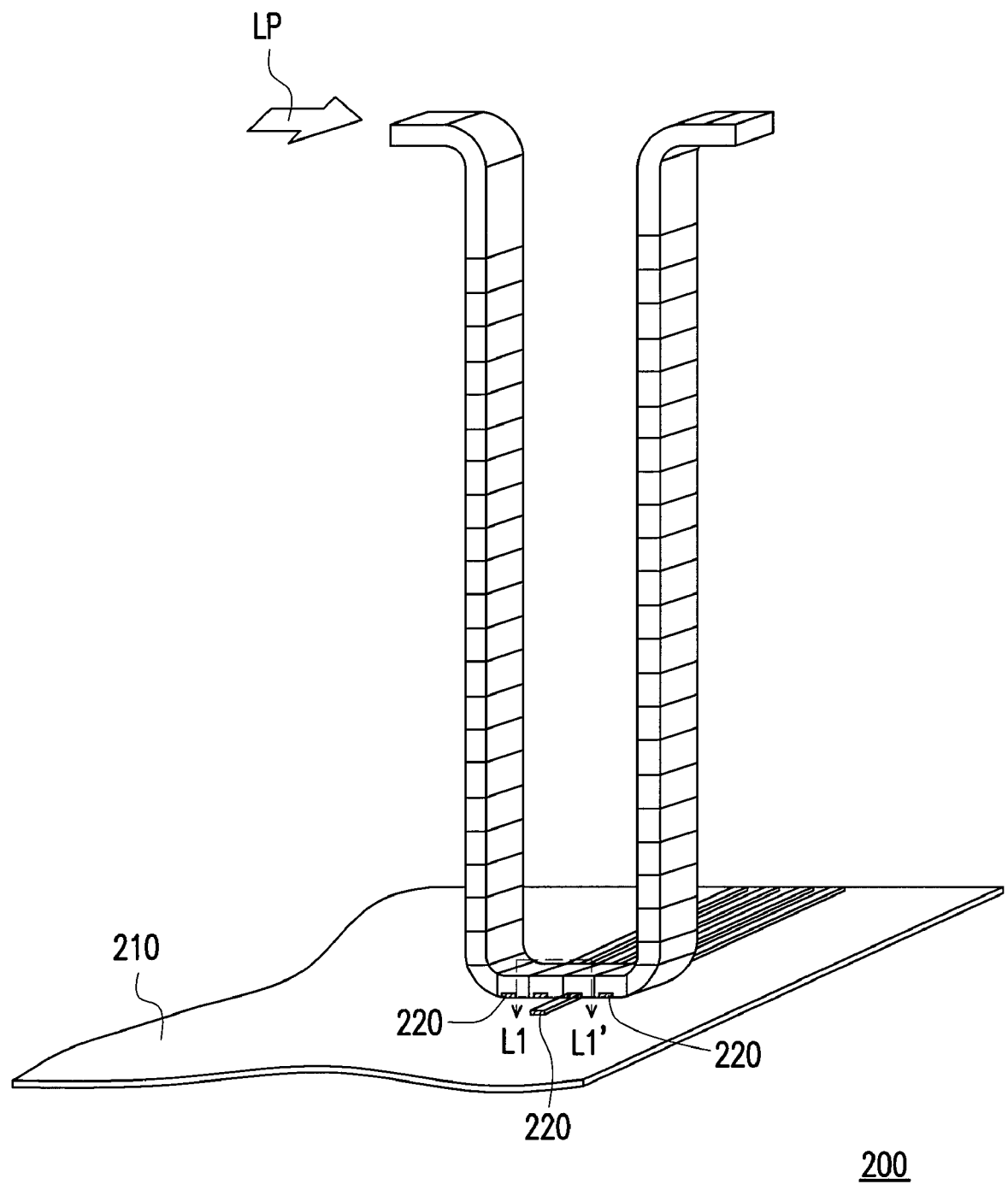
FIG. 2 is a partial view of a magnetic memory according to an embodiment of the present invention.
Figure 3:
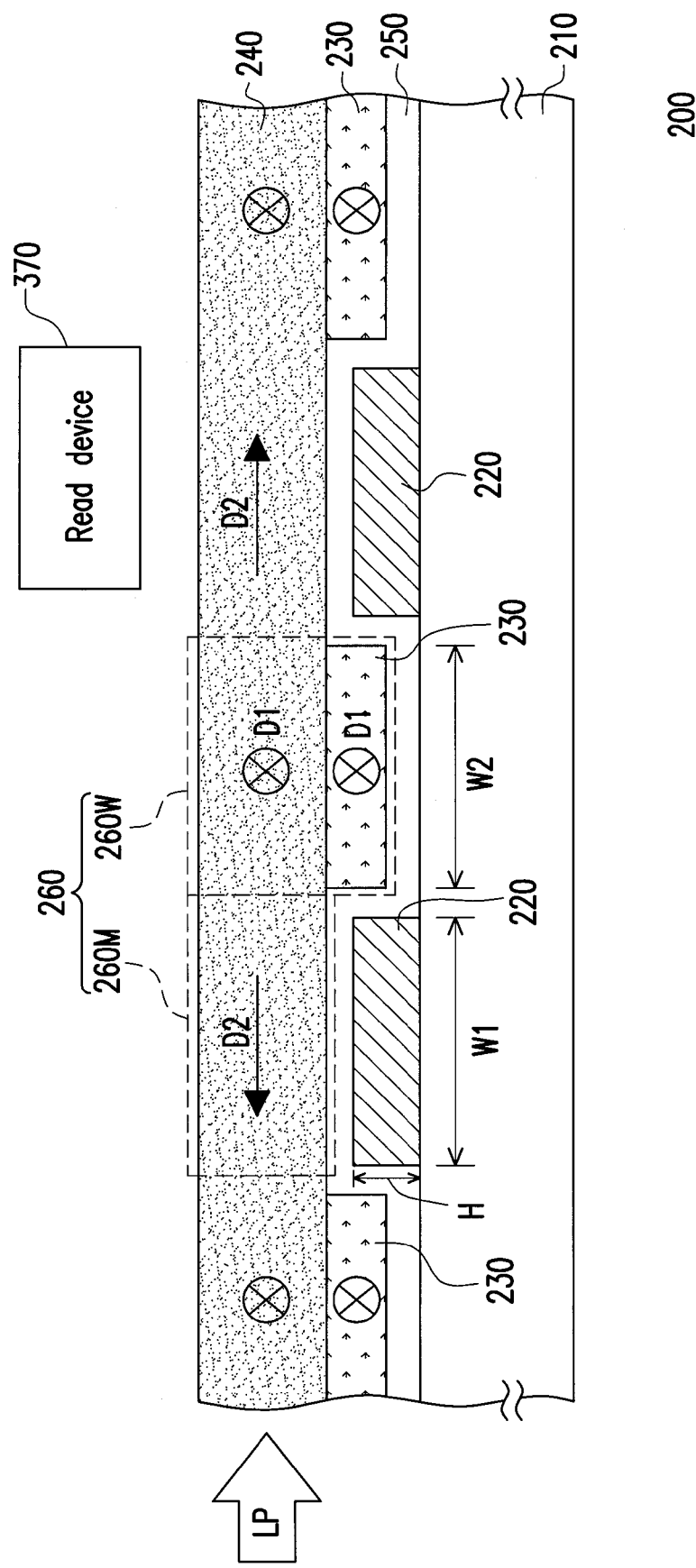
FIG. 3 is a cross-sectional view of the magnetic memory in FIG. 2 along line L1-L1'.

FIG. 2 is a partial view of a magnetic memory according to an embodiment of the present invention. FIG. 3 is a cross-sectional view of the magnetic memory in FIG. 2 along line L1-L1'. Referring to both FIG. 2 and FIG. 3, in the present embodiment, the magnetic memory 200 includes a plurality of lead structures 220, a plurality of first magnetic metal structures 230, a second magnetic metal structure 240, and an insulation layer 250 disposed on a substrate 210, wherein the substrate 210 may be made of glass, ceramic, or a semiconductor material.

The lead structures 220 do not intersect each other. Each of the first magnetic metal structures 230 is respectively disposed between adjacent two of the lead structures 220. The first magnetic metal structures 230 may present a linear arrangement. The second magnetic metal structure 240 covers the lead structures 220, the insulation layer 250, and the first magnetic metal structures 230 and spans over the lead structures 220. The insulation layer 250 is disposed between the lead structures 220 and the first magnetic metal structures 230 to electrically insulate the lead structures 220 and the first magnetic metal structures 230, and the insulation layer 250 is also disposed between the lead structures 220 and the second magnetic metal structure 240 to electrically insulate the lead structures 220 and the second magnetic metal structure 240.

In the present embodiment, the first magnetic metal structures 230 and the second magnetic metal structure 240 belong to different layers, wherein the first magnetic metal structures 230 may be made of an antiferromagnetic material and the second magnetic metal structure 240 may be made of a ferromagnetic material. In the present embodiment, a magnetization process is performed to each of the first magnetic metal structures 230 in advance to allow the first magnetic metal structure 230 to have a magnetic coupling force direction D1 (denoted by the symbol "⊗"). Herein the first magnetic metal structures 230 are equivalent to a magnetic pinned layer. Because each of the first magnetic metal structures 230 has a specific magnetic coupling force in the magnetic coupling force direction D1, part of the second magnetic metal structure 240 located above the first magnetic metal structure 230 receives the specific magnetic coupling force. Accordingly, a plurality of pinning fields is formed by the first magnetic metal structures 230 having the specific magnetic coupling forces and the parts of the second magnetic metal structure 240 located above the first magnetic metal structures 230. In the present embodiment, domain walls 260W between different magnetic memory cells 260 are formed by the first magnetic metal structures 230 and the parts of the second magnetic metal structure 240 having the pinning fields.

On the other hand, a corresponding magnetic moment direction D2 may be produced by the part of the second magnetic metal structure 240 located above the lead structures 220 according to the current direction of a data pulse passed through the lead structures 220. Because the current direction in the lead structures 220 may be entering or exiting the surface, the corresponding part of the second magnetic metal structure 240 may have a rightward or leftward magnetic moment direction D2. Substantially, the leftward or rightward magnetic moment direction D2 may be used for representing the bit data of "0" or "1". Thus, in the present embodiment, these parts of the second magnetic metal structure 240 which has the rightward or leftward magnetic moment direction D2 is referred to as magnetic domains 260M, wherein each of the magnetic domains 260M is suitable for storing a bit data.

In the present embodiment, the thickness H of each lead structure 220 is substantially between 10 nm and 50 nm. In addition, the width W1 of each lead structure 220 may be between 50 nm and 500 nm, wherein the width W1 of the lead structure 220 is determined by the current fabricating technique but is not limited in the present invention. The lead structures 220 may be periodically disposed on the substrate 210 so that each of the first magnetic metal structures 230 has an identical width W2. Accordingly, the periodically arranged domain walls 260W are formed in the magnetic memory 200, wherein the width of the domain walls 260W is from a hundred nanometers to several hundreds of nanometers. In an exemplary embodiment of the present invention, the width of the domain walls 260W is about 65 nm. Similarly, the magnetic memory 200 also has the periodically arranged magnetic domains 260M, wherein the width of the magnetic domains 260M is from a hundred nanometers to several microns. For example, the width of the magnetic domains 260M may be achieved as 1~2 μm according to the existing fabricating technique, and in an exemplary embodiment of the present invention, the width of the domain walls 260W is about 65 nm.

Conventionally, notches are formed to form the domain walls for separating adjacent magnetic domains. However, in the present embodiment, the lead structures 220 are disposed such that the magnetic domains 260M and the domain walls 260W are formed naturally. As a result, the complexity and difficulty in manufacturing the magnetic memory 200 are reduced and the process yield is improved.

As shown in FIG. 3, a domain wall 260W having a fixed magnetic coupling force direction D1 is located between two adjacent lead structures 220. Thus, the domain walls 260W are formed through the magnetic coupling force direction D1 for separating different magnetic domains 260M, wherein the magnetic domains 260M are suitable for storing bit data of "0" or "1". In the present embodiment, a magnetic domain 260M and an adjacent domain wall 260W form a magnetic memory cell 260. Accordingly, the structure composed of the first magnetic metal structures 230 and the second magnetic metal structure 240 includes a plurality of magnetic memory cells 260 which are connected with each other.

In the present embodiment, when a forward current pulse is supplied to the second magnetic metal structure 240, the bit data in each of the magnetic domains 260M is pushed into a next magnetic domain 260M. Contrarily, when a backward current pulse is supplied to the second magnetic metal structure 240, the bit data in each of the magnetic domains 260M is pushed into a previous magnetic domain 260M. In short, the bit data is shifted out of the current magnetic domain 260M and into the adjacent magnetic domain 260M through the current pulse received by the second magnetic metal structure 240, wherein the period during which the bit data is shifted out of or into the magnetic domain 260M is referred to as an shift period. However, in the present embodiment, the lead structures 220 receive an AC signal during the shift period such that the second magnetic metal structure 240 can receive a magnetic pulse of a specific frequency. Because the AC signal received by the lead structures 220 provides the magnetic pulse of the specific frequency to the second magnetic metal structure 240, the current density of the current pulse supplied to the second magnetic metal structure 240 is reduced, and accordingly the power consumption of the magnetic memory 200 is also reduced. Please refer to the article of "Resonant domain wall depinning included by oscillating spin-polarized currents in thin ferromagnetic strips" (PHYSICAL REVIEW B 77, 144417) published by E. Martinez, L. Lopez-Diaz, O. Alejos and L. Torres in 2008 and the article of "Oscillatory dependence of current-driven magnetic domain wall motion on current pulse length" (Nature, 443, pp. 197-200) published by L. Thomas, M. Hayashi, X. Jiang, R. Moriya, C. Rettner and S. S. P. Parkin in 2006 for the related principles. Below, a driving method of the magnetic memory cells 260 in the present embodiment will be described with reference to signal waveforms.

Figure 4A:
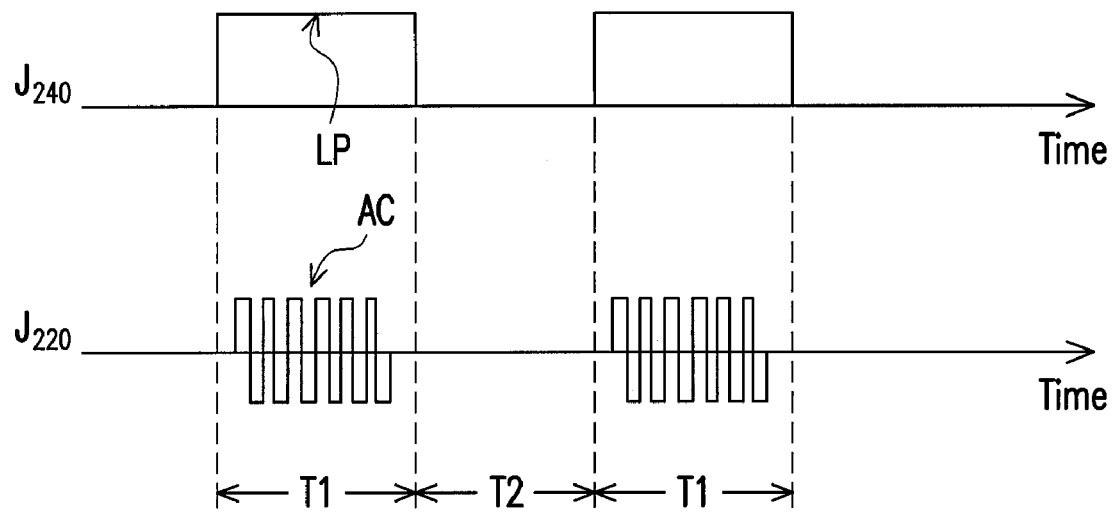
FIG. 4A and FIG. 4B respectively illustrate a driving waveform of a magnetic memory cell according to an embodiment of the present invention.
Figure 4B:
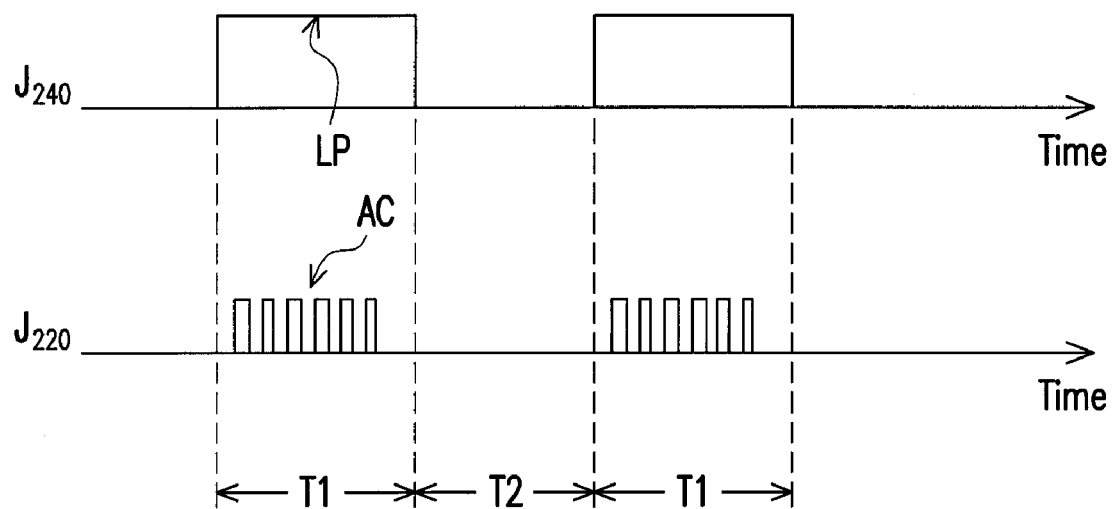

FIG. 4A and FIG. 4B respectively illustrate a driving waveform of a magnetic memory cell according to an embodiment of the present invention, wherein $J_{240}$ represents the waveform of a low current pulse received by the second magnetic metal structure 240, and $J_{220}$ represents the waveform of a signal received by the lead structures 220. Referring to both FIG. 3 and FIG. 4A, in the present embodiment, during a shift period T1, each of the lead structures 220 receives an AC signal AC, and the second magnetic metal structure 240 receives a low current pulse LP. Because the AC signal AC received by the lead structures 220 provides a magnetic pulse of a specific frequency to the second magnetic metal structure 240, the current density of the low current pulse LP supplied to the second magnetic metal structure 240 is reduced. Herein, the bit data is shifted out of or into the magnetic domain 260M by the low current pulse LP.

In the present embodiment, the frequency of the AC signal AC is substantially between $10^6$ Hz and $10^9$ Hz, and the current density of the low current pulse LP is substantially between $10^6$ amp/cm2 and $10^7$ amp/cm2. Compared to the conventional technique, no high current pulse is needed for shifting the bit data in the present invention; instead the bit data is shifted out of or into the magnetic domain 260M by the low current pulse LP. Accordingly, the power consumed for driving the magnetic memory cells 260 is greatly reduced.

After the shift period T1, the bit data remains in the magnetic domain 260M until the next shift period T1 starts, wherein the period during which the bit data remains in the magnetic domain 260M is referred to as a read/write period T2. It should be mentioned herein that during the read/write period T2, the bit data in the magnetic domain 260M is updated by the corresponding lead structure 220. To be specific, in the present embodiment, the bit data in the magnetic domain 260M is updated by the lead structure 220 located under the magnetic domain 260M. For example, when the magnetic moment direction D2 corresponding to the bit data in the magnetic domain 260M in FIG. 3 is a leftward magnetic moment direction, a intensive magnetic field is produced by the data pulse (current) in the lead structure 220 under the magnetic domain 260M during the read/write period T2 such that the bit data in the magnetic domain 260M is turned into a rightward magnetic moment direction D2.

It should be mentioned that in the present embodiment, the waveform $J_{220}$ of the signal received by the lead structures 220 is the bipolar signal waveform illustrated in FIG. 4A. However, in another embodiment of the present invention, the waveform $J_{220}$ of the signal received by the lead structures 220 may be the unipolar signal waveform illustrated in FIG. 4B. In short, the state of the signal waveform $J_{220}$ is not limited in the present invention.

Conventionally, an additional write device is disposed in a magnetic memory for updating bit data in the magnetic domains. However, in the present embodiment, the bit data is updated by using the lead structure 220 corresponding to the magnetic domain 260M. Thereby, no additional write device is disposed in the magnetic memory 200 of the present embodiment. As a result, the structure of the magnetic memory 200 is simplified, and the complexity in manufacturing the magnetic memory 200 is reduced. It should be mentioned herein that in the present embodiment, one of the lead structures 220 is selectively used for updating the bit data. In another embodiment of the present invention, one of the lead structures 220 (referred to as a primary write lead thereinafter) and two or more lead structures 220 (referred to as secondary write leads thereinafter) adjacent to the primary write lead may be selected for updating the bit data. Then, during a read/write period T2, a data pulse (current) is supplied to the primary write lead to generate an intensive magnetic, and meanwhile, a secondary pulse (current) is supplied to the secondary write leads to generate a secondary magnetic field, so that the bit data in the magnetic domain 260M corresponding to the primary write lead is updated, wherein the magnetic force of the secondary magnetic field is not intensity enough for altering the magnetic moment direction of the other magnetic domains. Thus, the success rate in updating the bit data is improved.

Any one of the lead structures 220 can be selected for updating the bit data by those having ordinary knowledge in the art according to the actual requirement. In another embodiment of the present invention, some or all the lead structures 220 may be selected for simultaneously updating the bit data in multiple magnetic memory cells 260.

On the other hand, the bit data in the magnetic domain 260M may also be read during the read/write period T2. To be specific, in the present embodiment, the magnetic memory 200 may further include a read device 370 disposed above the second magnetic metal structure 240 for reading the bit data in the corresponding magnetic domain 260M.

Figure 5:
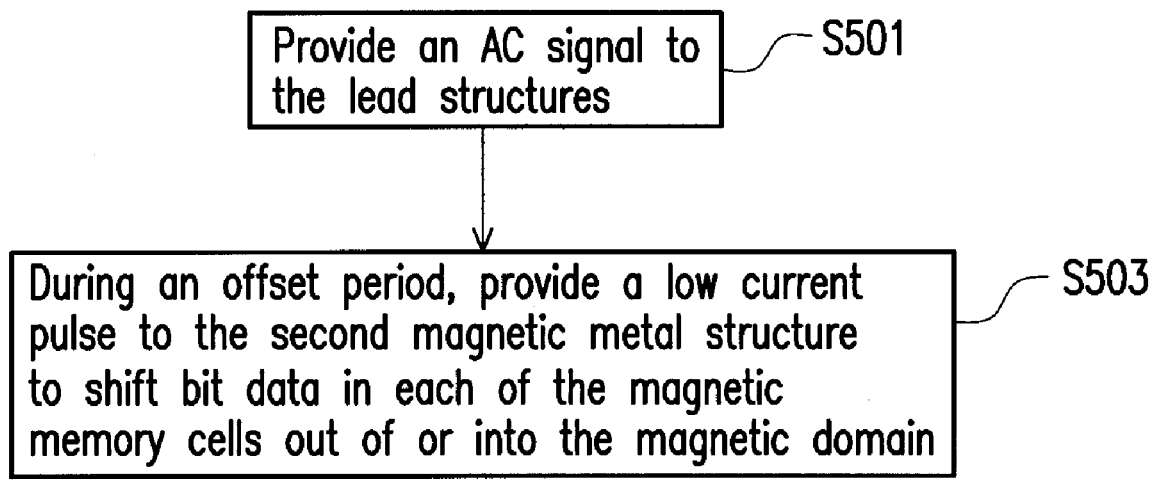
FIG. 5 is a flowchart of a driving method of a magnetic memory according to an embodiment of the present invention.

A driving method of the magnetic memory 200 is further provided by the present embodiment. FIG. 5 is a flowchart of the driving method of the magnetic memory 200. Referring to FIGS. 3, 4, and 5, in step S501, an AC signal AC is provided to the lead structures 220 during an shift period T1. In step S503, a low current pulse LP is provided to the second magnetic metal structure 240 during the shift period T1 to shift the bit data in each of the magnetic memory cells 260 out of or into the magnetic domain 260M. It should be noted that the steps S501 and S503 in the present embodiment take place at the same time. The other operation details of the magnetic memory 200 during the shift period T1 or the read/write period T2 may be referred to foregoing descriptions and will not be described herein.

A manufacturing method of the magnetic memory 200 is further provided by the present embodiment. FIGS. 6A~6E are perspective cross-sectional views illustrating the manufacturing method, wherein only a part of the magnetic memory 200 along the line L1-L1' in FIG. 2 is illustrated. First, referring to FIG. 6A, a plurality of lead structures 220 is formed on the substrate 210, wherein the lead structures 220 do not intersect each other. In the present embodiment, the lead structures 220 may be disposed on the substrate 210 in parallel.

Figure 6A:
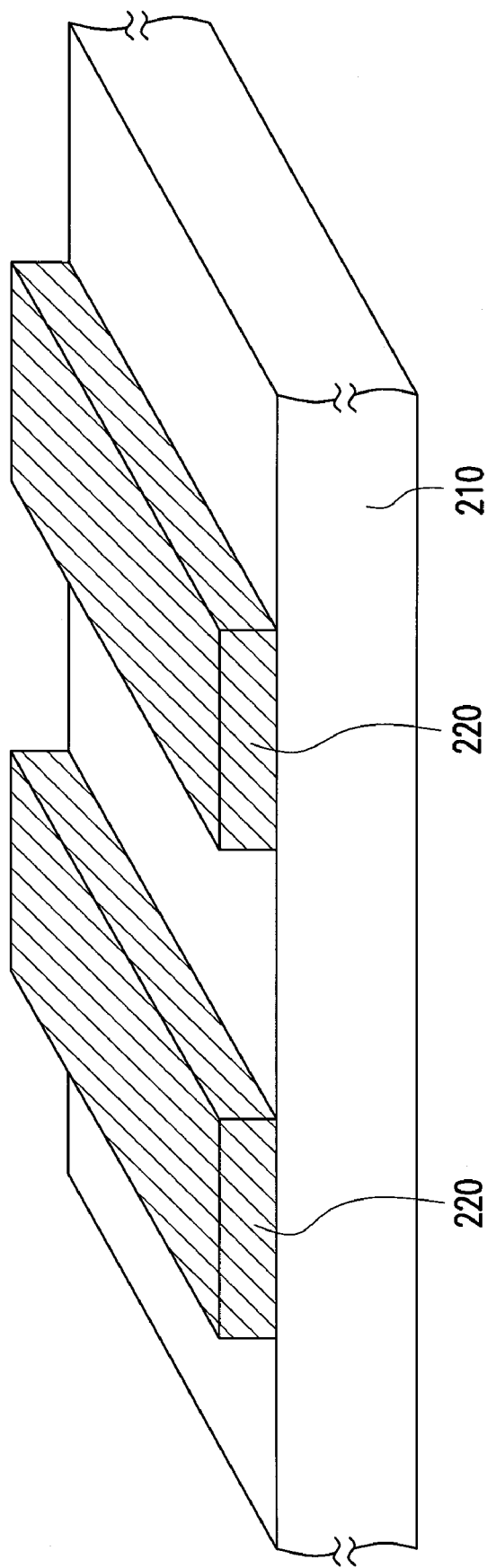
FIGS. 6A~6E are perspective cross-sectional views illustrating a manufacturing method of a magnetic memory according to a first embodiment of the present invention.
Figure 6B:
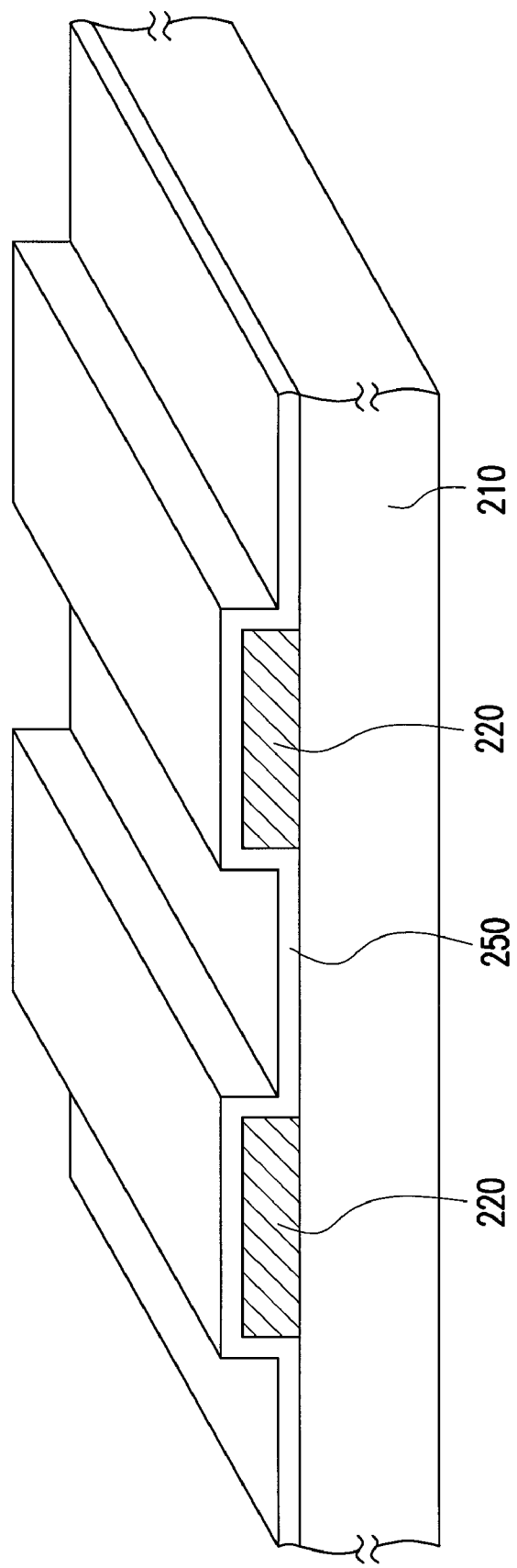
Figure 6B:
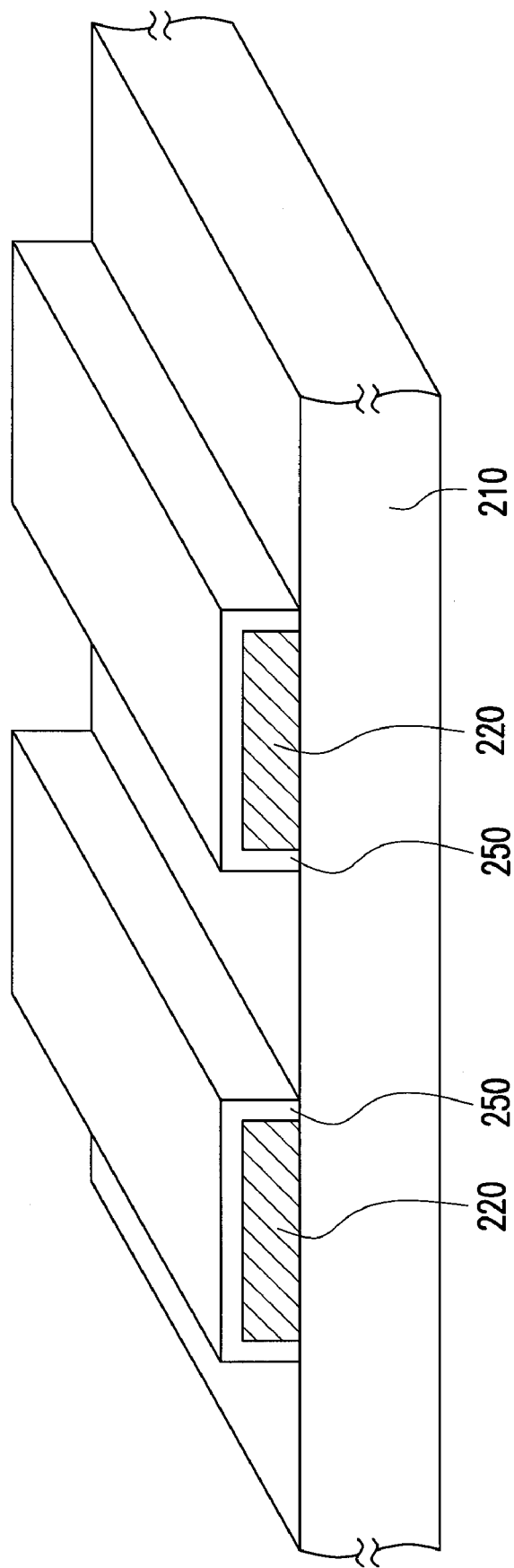
Figure 6C:
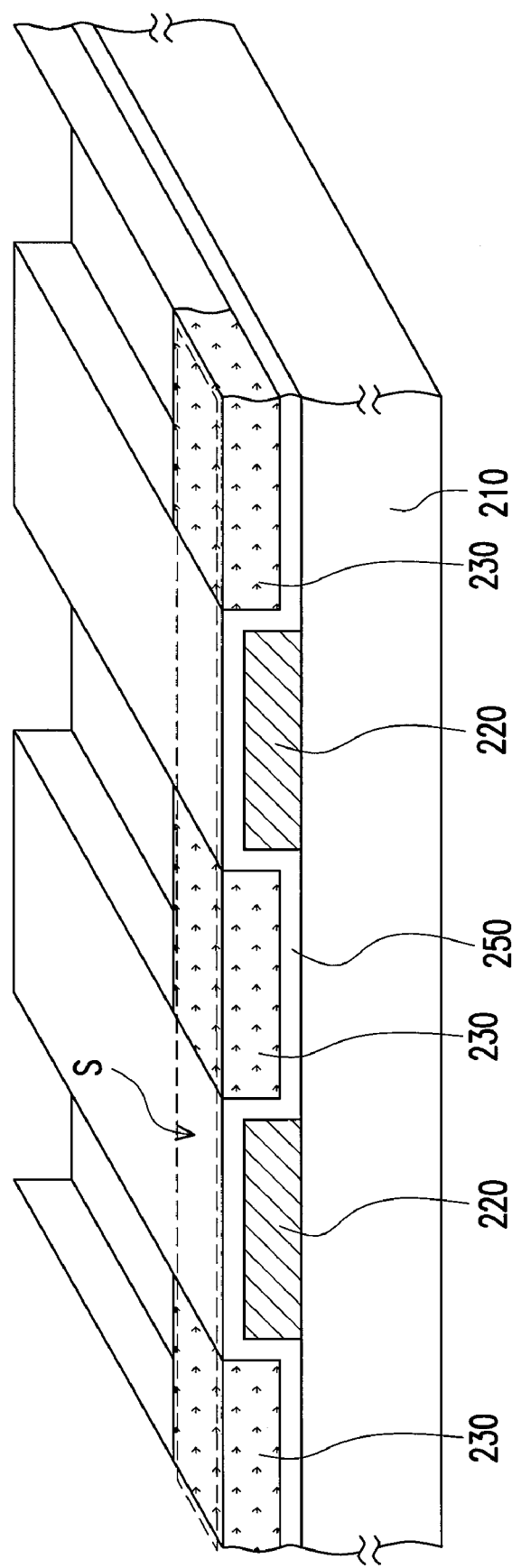

Then, referring to FIG. 6B, an insulation layer 250 is formed on the substrate 210, wherein the insulation layer 250 covers the lead structures 220. In the present embodiment, the insulation layer 250 may completely cover the substrate 210 and the lead structures 220. However, in another embodiment of the present invention, the insulation layer 250 may be patterned according to the actual requirement so that the insulation layer 250 only covers parts of the substrate 210 or even parts of the lead structures 220. For example, as shown in FIG. 6B', the pattern of the insulation layer 250 may be formed on the substrate 210 according to the pattern of the lead structures 220, wherein the insulation layer 250 may completely cover the lead structures 220 but not cover the parts of the substrate 210 between adjacent two lead structures 220. In short, the main purpose of the pattern of the insulation layer 250 is to electrically insulate the lead structures 220 and the first/second magnetic metal structures 230/240. Thus, the pattern of the insulation layer 250 is not limited in the present invention.

In the present embodiment, the insulation layer 250 illustrated in FIG. 6B is taken as an example. Thereafter, referring to FIG. 6C, a plurality of first magnetic metal structures 230 is formed on the insulation layer 250, wherein the first magnetic metal structures 230 may present a linear arrangement and may be respectively disposed between adjacent two lead structures 220. In the present embodiment, top surfaces of the first magnetic metal structures 230 may be aligned with the top surface of the insulation layer 250 so that the top surfaces of the first magnetic metal structures 230 and the top surface of the insulation layer 250 form a flat top surface S. In addition, the material of the first magnetic metal structures 230 includes a ferromagnetic material or an antiferromagnetic material, wherein the ferromagnetic material may be a horizontal ferromagnetic material (for example, CoFe, NiFe, and CoFeB, etc) or a vertical ferromagnetic material (for example, Fe—Pt, Co—Pt, or Co—Ni multilayer, etc), and the antiferromagnetic material may be PtMn and IrMn, etc.

Figure 6D:
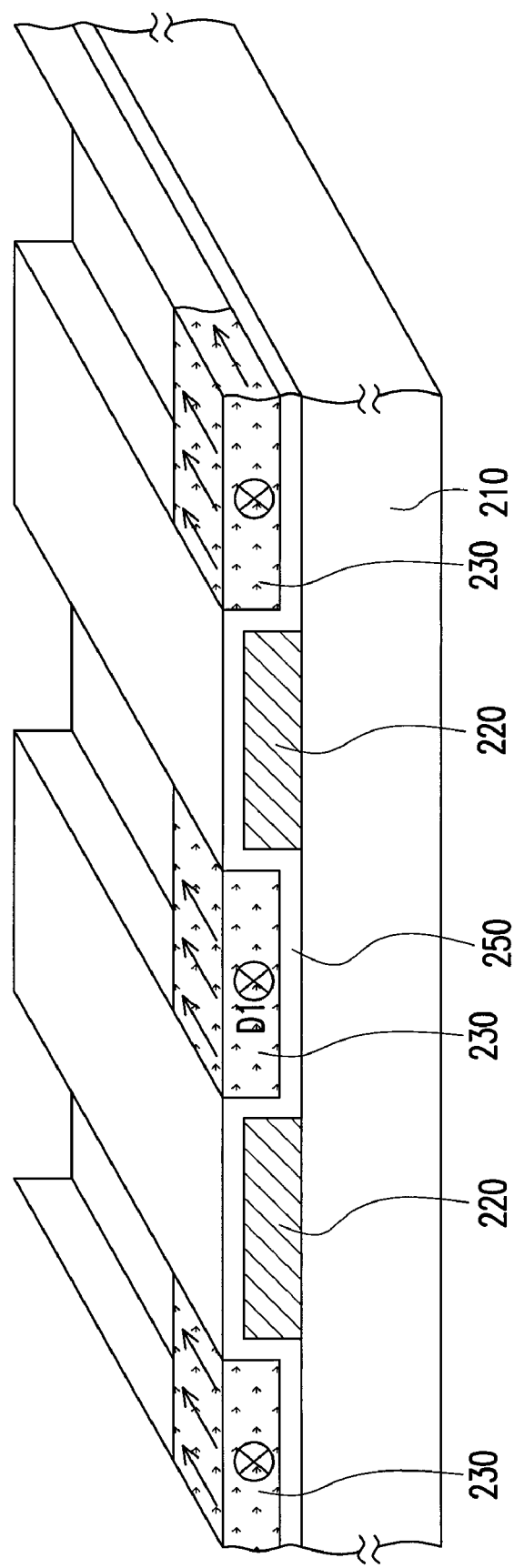

After that, referring to FIG. 6D, a magnetization process is performed to the first magnetic metal structures 230 so that the first magnetic metal structures 230 can have a specific magnetic coupling force permanently and accordingly produce a magnetic coupling force direction D1. In the present embodiment, the magnetic coupling force direction D1 may be entering the surface.

Figure 6E:
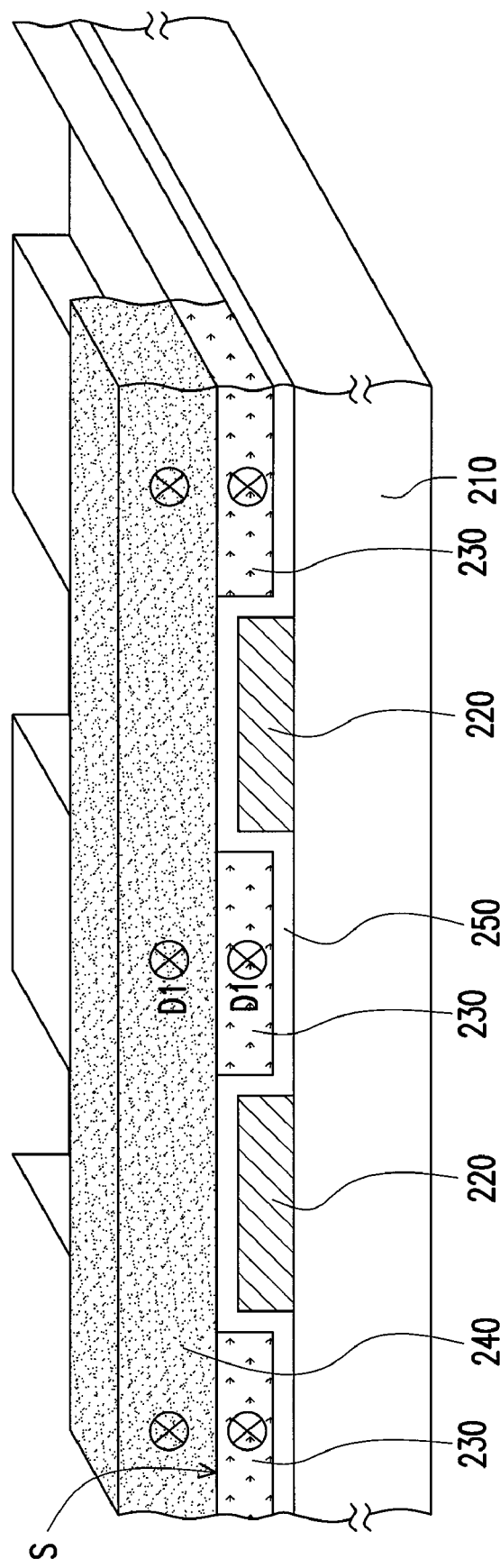

Thereafter, referring to FIG. 6E, a second magnetic metal structure 240 is formed on the insulation layer 250, wherein the second magnetic metal structure 240 may be formed on the flat top surface S of the substrate 210. The second magnetic metal structure 240 covers the first magnetic metal structures 230 and spans over the lead structures 220. In addition, the extension direction of the second magnetic metal structure 240 is different from the magnetic coupling force direction D1, wherein the extension direction of the second magnetic metal structure 240 may be perpendicular to the magnetic coupling force direction D1. In the present embodiment, the material of the second magnetic metal structure 240 may be a horizontal ferromagnetic material (for example, CoFe, NiFe, and CoFeB, etc) or a vertical ferromagnetic material (for example, Fe—Pt, Co—Pt, or Co—Ni multilayer, etc). Through foregoing steps, the magnetic memory 200 in the present embodiment is completed.

As described above, a structure composed of the first magnetic metal structures 230 and the second magnetic metal structure 240 is divided into a plurality of magnetic memory cells 260 connected with each other through the dispositions of the lead structures 220, wherein each of the magnetic memory cells 260 has a magnetic domain 260M and a domain wall 260W adjacent to the magnetic domain 260M, and the domain wall 260W is located between adjacent two lead structures 220.

As described above, the magnetic memory 200 can be manufactured through a general photolithography process in the present embodiment. Compared to the conventional technique wherein the domain walls have to be formed by forming notches, the manufacturing process in the present embodiment is simpler and offers a higher process yield.

Second Embodiment

The present embodiment is similar to the first embodiment. Compared to the first embodiment, the first magnetic metal structures and the second magnetic metal structure are further integrated into the same layer (i.e., a magnetic metal structure 735) in the present embodiment.

Figure 7:
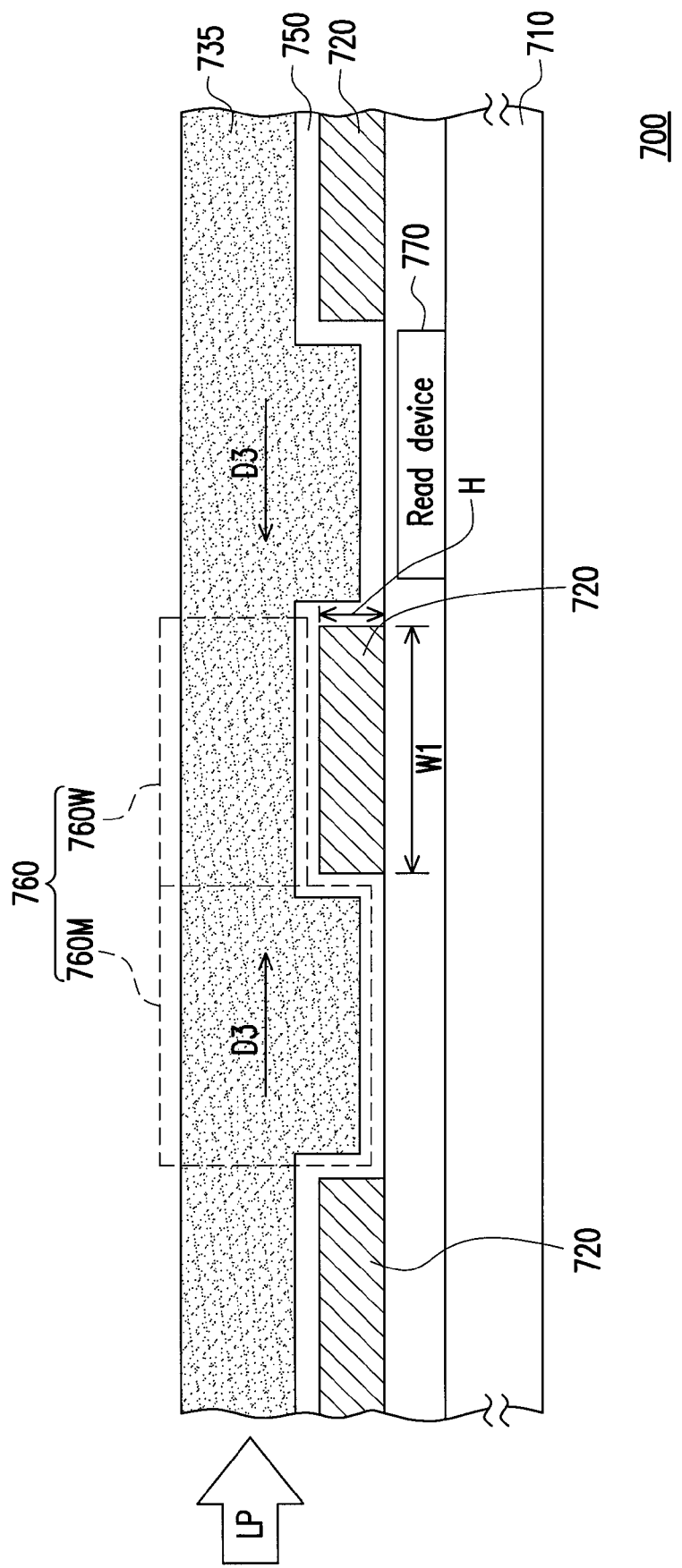
FIG. 7 is a partial cross-sectional view of a magnetic memory according to a second embodiment of the present invention.

FIG. 7 is a partial cross-sectional view of a magnetic memory according to the second embodiment of the present invention. Referring to FIG. 7, in the present embodiment, the magnetic memory 700 includes a plurality of lead structures 720, a magnetic metal structure 735, and an insulation layer 750 disposed on a substrate 710. The substrate 710 may be made of glass, ceramic, or a semiconductor material.

The lead structures 720 do not intersect each other. The magnetic metal structure 735 covers the lead structures 720 and the insulation layer 750 and spans over the lead structures 720. The magnetic metal structure 735 may present a linear arrangement. The insulation layer 750 is disposed between the lead structures 720 and the magnetic metal structure 735 for electrically insulating the lead structures 720 and the magnetic metal structure 735.

As described above, a magnetic metal material is deposited on the lead structures 720 to form the magnetic metal structure 735. Accordingly, it can be considered that the lead structures 720 are embedded in the magnetic metal structure 735. A plurality of magnetic memory cells 760 are defined in the magnetic metal structure 735 by embedding the lead structures 720 in the magnetic metal structure 735. The magnetic metal structure 735 embedded with a plurality of lead structures is equivalent to the magnetic metal track 120 having the notch portions 122W illustrated in FIG. 1; however, the notch forming step in the conventional technique is skipped so that the complexity and difficulty in manufacturing the magnetic memory 700 are reduced and the process yield is improved.

In other words, by adopting the special structure of the embedded lead structures, the parts of the magnetic metal structure 735 located above the lead structures 720 form domain walls 760W between different magnetic memory cells 760. Thus, magnetic domains 760M are formed between adjacent domain walls 760W (i.e., between adjacent lead structures 720), wherein each of the magnetic domains 760M is suitable for storing a bit data.

The current directions of data pulses passed through adjacent two lead structures 720 may provide a rightward or leftward magnetic field direction D3 to the magnetic domain 760M between the two lead structures 720 for setting/altering the magnetic moment direction of the magnetic domain 760M. For example, when the magnetic field direction D3 corresponding to the bit data in the magnetic domain 760M in FIG. 7 is a rightward magnetic field direction, an intensive magnetic field may produced by the data pulses (currents exiting the surface) passed through two lead structures 720 adjacent to the magnetic domain 760M during a read/write period T2 for turning the bit data in the magnetic domain 760M into the leftward magnetic field direction D3.

The rightward or leftward magnetic field direction D3 may be defined as the bit data of "0" or "1". As shown in FIG. 7, in the present embodiment, the magnetic domain 760M is located between adjacent two lead structures 720, and the magnetic field directions D3 (i.e., the bit data) in the adjacent two magnetic domains 760M are separated by the domain wall 760W.

In the present embodiment, the thickness H of each of the lead structures 720 is substantially between 10 nm and 50 nm. In addition, the width W1 of each of the lead structures 720 may be between 50 nm and 500 nm, wherein the width W1 of the lead structures 220 is determined by the current fabricating process technique but not limited in the present invention. The lead structures 720 may be disposed on the substrate 710 periodically. Accordingly, the magnetic memory 700 has periodically arranged domain walls 760W and magnetic domains 760M, wherein the domain walls 760W and the magnetic domains 760M are disposed alternatively. In addition, the width of the domain walls 760W may be smaller than the width W1 of the lead structures 220, and which may range from a hundred nanometers to several hundreds of nanometers. In an exemplary embodiment of the present invention, the width of the domain walls 260W is about 65 nm. The width of the magnetic domains 760M may be greater than the width of the domain walls 260W, and which may range from several hundreds of nanometers to several microns. In an exemplary embodiment of the present invention, the width of the domain walls 260W is about 65 nm. Additionally, in the present embodiment, a magnetic domain 760M and an adjacent domain wall 760W form a magnetic memory cell 760. In other words, the magnetic metal structure 735 includes a plurality of magnetic memory cells 760 connected with each other.

As described above, the magnetic metal structure 735 is divided into a plurality of magnetic memory cells 760 connected with each other through the dispositions of the lead structures 720, wherein each of the magnetic memory cells 760 has a magnetic domain 760M and a domain wall 760W adjacent to the magnetic domain 760M. In other words, in the present embodiment, the magnetic domains 260M and the domain walls 260W are naturally formed through the dispositions of the lead structures 220, and accordingly the notches forming step in the conventional technique is skipped and the complexity of the manufacturing process is reduced.

In the present embodiment, the operation of the magnetic memory 700 can be divided into a read/write period and an shift period. However, the driving method of the magnetic memory cells in the present embodiment is similar to that in the first embodiment therefore may be referred to FIGS. 4 and 5 and the description of the first embodiment.

It should be noted that during the shift period T1, each of the lead structures 720 receives an AC signal AC and the magnetic metal structure 735 receives a low current pulse LP. Because the AC signal AC received by the lead structures 720 provides a magnetic pulse of a specific frequency to the magnetic metal structure 735, the current density of the low current pulse LP supplied to the magnetic metal structure 735 is reduced. Herein, the bit data is shifted out of the current magnetic domain 760M and into an adjacent magnetic domain 760M by the low current pulse LP received by the magnetic metal structure 735. On the other hand, the bit data in the magnetic domain 760M can also be read or updated during the read/write period T2. In the present embodiment, the bit data in the magnetic domain 760M is updated by the corresponding lead structures 720. To be specific, the bit data in the magnetic domain 760M is updated by the adjacent two lead structures 720. In the present embodiment, two adjacent lead structures 720 may be selected from the lead structures 720 for updating the bit data. In addition, the magnetic memory 700 may further include a read device 770 for reading the bit data, wherein the read device 770 may be disposed below the magnetic metal structure 735 for reading the bit data in the corresponding magnetic domain 760M.

Conventionally, an additional write device is disposed in the magnetic memory for updating the bit data in the magnetic domains. However, in the present embodiment, the bit data is updated by using the lead structure 220 corresponding to the magnetic domain 260M. Thus, no additional write device is needed in the present embodiment, and accordingly both the structure of the magnetic memory 200 and the manufacturing process thereof are simplified.

However, any two adjacent lead structures 720 may be selected for updating the bit data by those having ordinary knowledge in the art according to the actual requirement. Or, the bit data may also be updated by using the primary write lead and secondary write leads described in the first embodiment in order to improve the success rate in writing the bit data. In another embodiment of the present invention, multiple sets of adjacent leads may be selected for simultaneously updating bit data in multiple magnetic memory cells 760.

As described above, in the present embodiment, the bit data is shifted out of or into the magnetic domain 260M by a low current pulse LP and the AC signal AC received by the lead structures 720. Thus, the power consumption of the magnetic memory 700 is reduced. Additionally, in the present embodiment, the bit data may also be updated by using the lead structures 720 so that no additional write device is needed in the magnetic memory 700.

A manufacturing method of foregoing magnetic memory 700 is also provided in the present embodiment. FIGS. 8A~8E are perspective cross-sectional views illustrating the manufacturing method, wherein only part of the magnetic memory 700 is illustrated. First, referring to FIG. 8A, a plurality of lead structures 720 is formed on a substrate 710, wherein the lead structures 720 do not intersect each other. In the present embodiment, the lead structures 720 may be disposed on the substrate 710 in parallel.

Figure 8A:
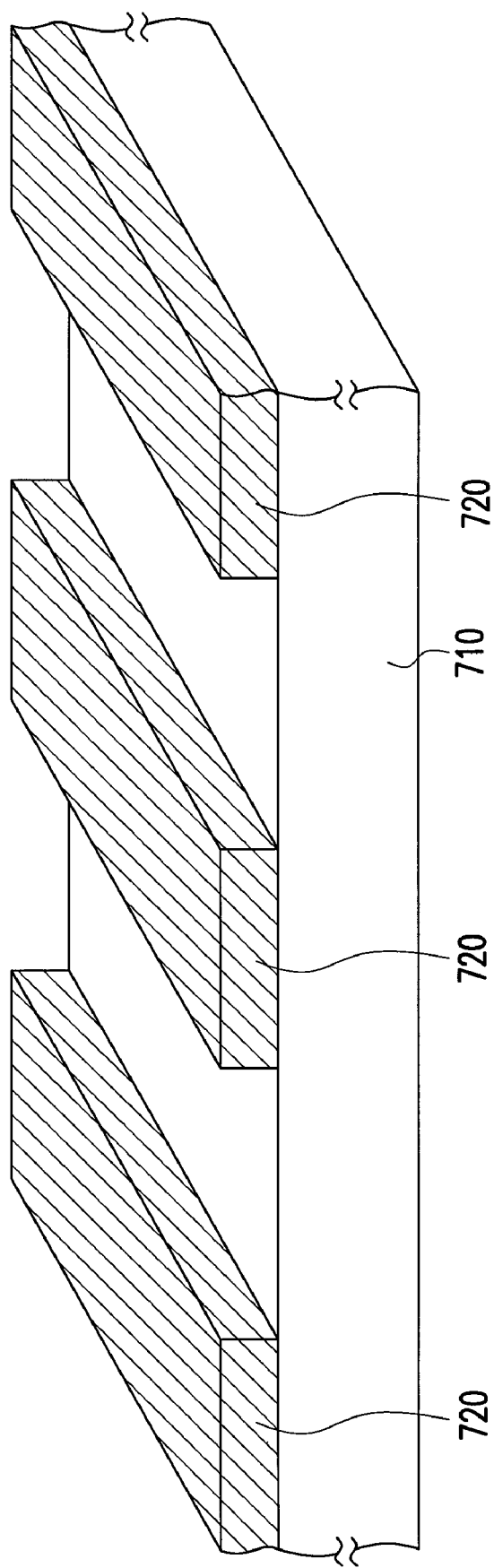
FIGS. 8A~8C are perspective cross-sectional views illustrating a manufacturing method of a magnetic memory according to the second embodiment of the present invention.
Figure 8B:
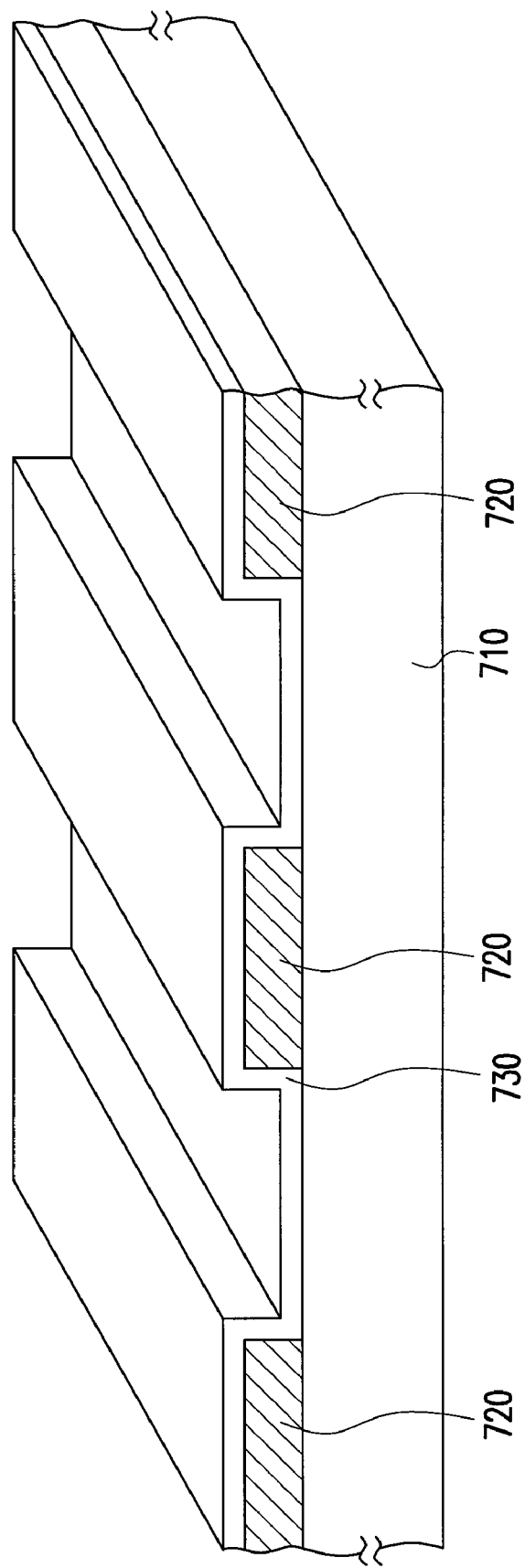
Figure 8B:
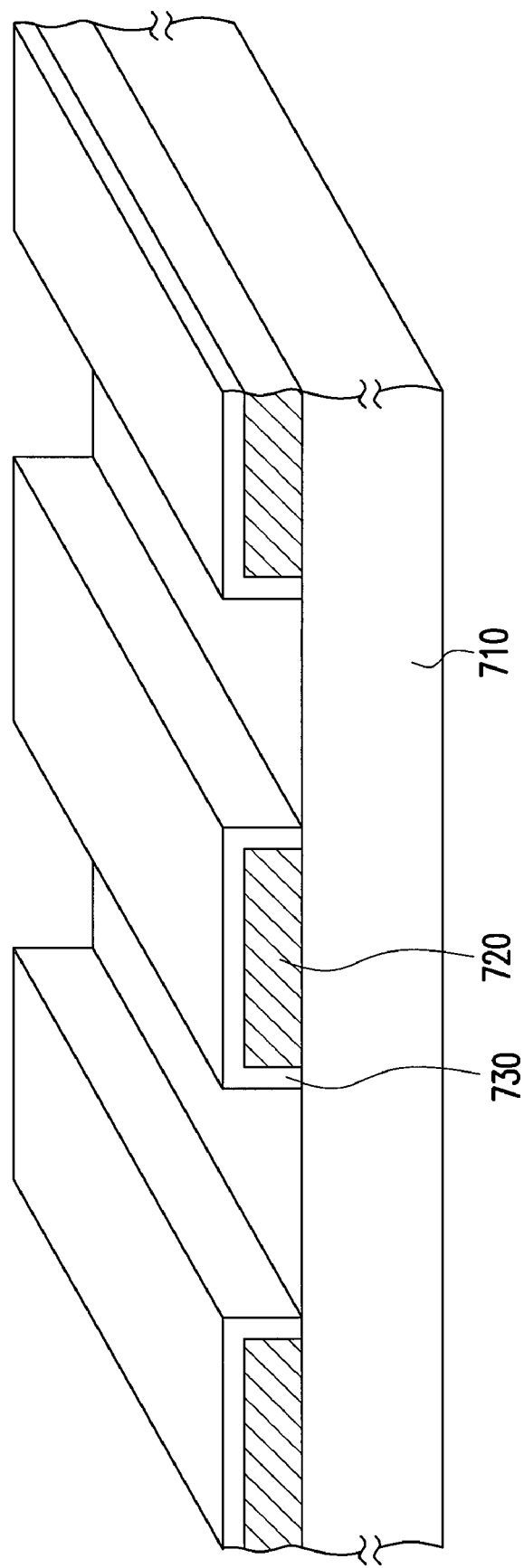
Figure 8C:
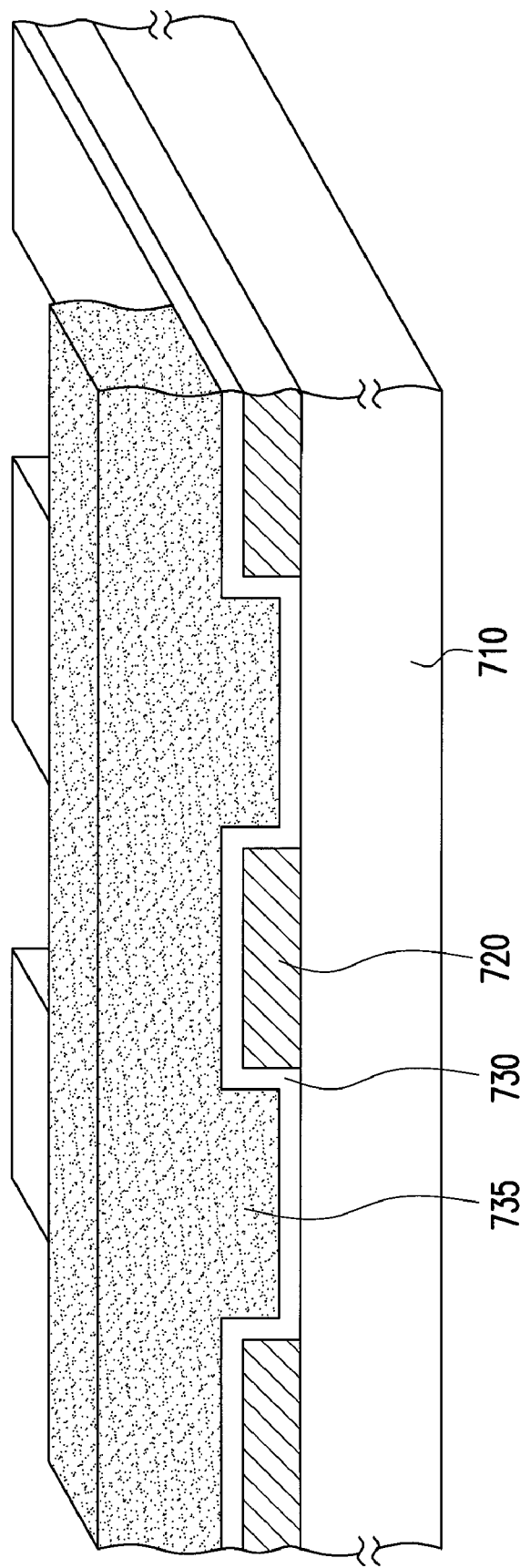

Then, referring to FIG. 8B, an insulation layer 750 is formed on the substrate 710, wherein the insulation layer 750 covers the lead structures 720. In the present embodiment, the insulation layer 750 may completely cover the substrate 710 and the lead structures 720. However, in another embodiment of the present invention, the insulation layer 750 may be patterned according to the actual requirement so that the insulation layer 750 covers only parts of the substrate 710 or even parts of the lead structures 720. For example, as shown in FIG. 8B', the pattern of the insulation layer 750 may be formed on the substrate 710 according to the pattern of the lead structures 720, wherein the insulation layer 750 may completely cover the lead structures 720 but not cover the part of the substrate 710 between adjacent two lead structures 720. In short, the main purpose of the pattern of the insulation layer 750 is to electrically insulate the lead structures 720 and the magnetic metal structure 735. Thus, the pattern of the insulation layer 750 is not limited in the present invention.

In the present embodiment, the insulation layer 250 illustrated in FIG. 8B is taken as an example. Thereafter, referring to FIG. 8C, a magnetic metal structure 735 is formed on the insulation layer 750, wherein the magnetic metal structure 735 presents a linear arrangement and spans over the lead structures 720. In the present embodiment, the material of the magnetic metal structure 735 may be a horizontal ferromagnetic material (for example, CoFe, NiFe, and CoFeB, etc) or a vertical ferromagnetic material (for example, Fe—Pt, Co—Pt, or Co—Ni multilayer, etc). Through foregoing steps, the magnetic memory 700 in the present embodiment is completed.

In the present embodiment, the magnetic memory 700 is manufactured through a general photolithography process. Compared to the conventional technique wherein the domain walls are formed as notches, the manufacturing process in the present embodiment is simpler and offers a higher process yield.

As described above, in the present invention, a plurality of lead structures is disposed in a magnetic memory such that the power consumption of the magnetic memory is reduced and the complexity and difficulty in manufacturing the magnetic memory are also reduced. In short, the driving method of the magnetic memory provided by the present invention consumes less power, and the manufacturing method of the magnetic memory provided by the present invention reduces the complexity and difficulty in manufacturing the magnetic memory and effectively improves the process yield.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A magnetic memory, comprising:
a plurality of lead structures, disposed on a substrate, wherein the lead structures do not intersect each other;
a plurality of first magnetic metal structures, disposed on the substrate, wherein each of the first magnetic metal structures is disposed between adjacent two of the lead structures;
a second magnetic metal structure, disposed on the substrate, covering the lead structures and the first magnetic metal structures, and spanning over the lead structures, wherein a structure formed by the first magnetic metal structures and the second magnetic metal structure comprises a plurality of magnetic memory cells connected with each other, each of the magnetic memory cells has a magnetic domain and a domain wall adjacent to the magnetic domain, and the magnetic domain is suitable for storing a bit data; and
an insulation layer, disposed between the lead structures and the first magnetic metal structures and between the lead structures and the second magnetic metal structure.

2. The magnetic memory according to claim 1, wherein the lead structures receive an alternating current (AC) signal during a shift period.

3. The magnetic memory according to claim 2, wherein the bit data is shifted into or out of the magnetic domain during the shift period according to a low current pulse received by the second magnetic metal structure.

4. The magnetic memory according to claim 1, wherein the magnetic domain in each of the magnetic memory cells is connected with the domain wall in the adjacent magnetic memory cell.

5. The magnetic memory according to claim 1, wherein the first magnetic metal structures present a linear arrangement.

6. The magnetic memory according to claim 1, wherein the first magnetic metal structures and the second magnetic metal structure belong to a same layer.

7. The magnetic memory according to claim 6, wherein the magnetic domain is located between adjacent two of the lead structures.

8. The magnetic memory according to claim 6, wherein a material of the first magnetic metal structures and the second magnetic metal structure comprise at least one of a horizontal ferromagnetic material and a vertical ferromagnetic material.

9. The magnetic memory according to claim 8, wherein the horizontal ferromagnetic material comprises CoFe, NiFe, or CoFeB.

10. The magnetic memory according to claim 8, wherein the vertical ferromagnetic material comprises Fe—Pt, Co—Pt, or Co—Ni multilayer.

11. The magnetic memory according to claim 1, wherein the first magnetic metal structures and the second magnetic metal structure belong to different layers.

12. The magnetic memory according to claim 11, wherein each of the first magnetic metal structures has a specific magnetic coupling force.

13. The magnetic memory according to claim 12, wherein the domain wall is located between adjacent two of the lead structures and has a magnetic coupling force direction produced by the specific magnetic coupling force.

14. The magnetic memory according to claim 11, wherein a material of the first magnetic metal structures comprises at least one of an antiferromagnetic material and a ferromagnetic material.

15. The magnetic memory according to claim 14, wherein the antiferromagnetic material comprises PtMn or IrMn.

16. The magnetic memory according to claim 14, wherein the ferromagnetic material comprises at least one of a horizontal ferromagnetic material and a vertical ferromagnetic material.

17. The magnetic memory according to claim 16, wherein the horizontal ferromagnetic material comprises CoFe, NiFe, or CoFeB.

18. The magnetic memory according to claim 16, wherein the vertical ferromagnetic material comprises Fe—Pt, Co—Pt, or Co—Ni multilayer.

19. The magnetic memory according to claim 11, wherein a material of the second magnetic metal structure comprises a ferromagnetic material.

20. The magnetic memory according to claim 19, wherein the ferromagnetic material comprises at least one of a horizontal ferromagnetic material and a vertical ferromagnetic material.

21. The magnetic memory according to claim 20, wherein the horizontal ferromagnetic material comprises CoFe, NiFe, or CoFeB.

22. The magnetic memory according to claim 21, wherein the vertical ferromagnetic material comprises Fe—Pt, Co—Pt, or Co—Ni multilayer.

23. The magnetic memory according to claim 1, wherein a thickness of each of the lead structures is substantially between 10 nm and 50 nm.

24. The magnetic memory according to claim 1, wherein a width of each of the lead structures is substantially between 50 mm and 500 nm.

25. The magnetic memory according to claim 1, wherein a width of the magnetic domain is about 65 nm.

26. The magnetic memory according to claim 1, wherein a width of the domain wall is about 65 nm.

27. The magnetic memory according to claim 1, wherein the bit data in one of the magnetic domains is updated by the corresponding lead structure during a read/write period.

28. The magnetic memory according to claim 27, wherein the bit data in the magnetic domain is updated by two of the lead structures adjacent to the magnetic domain.

29. The magnetic memory according to claim 27, wherein the bit data in the magnetic domain is updated by the lead structure under the magnetic domain.

30. The magnetic memory according to claim 1, further comprising:
a read device, disposed below one of the first magnetic metal structures, for reading the bit data in the corresponding magnetic domain during a read/write period.

31. The magnetic memory according to claim 1, further comprising:
a read device, disposed above the second magnetic metal structure, for reading the bit data in the corresponding magnetic domain during a read/write period.

32. A driving method of the magnetic memory according to claim 1, comprising:
providing an AC signal to the lead structures during an shift period; and
providing a low current pulse to the second magnetic metal structure during the shift period to shift the bit data in each of the magnetic memory cells out of or into the magnetic domain.

33. The driving method according to claim 32, further comprising:
providing a data pulse to one of the lead structures during a read/write period to update the bit data in the corresponding magnetic domain.

34. The driving method according to claim 32, further comprising:
providing a data pulse to adjacent two lead structures among the lead structures during a read/write period to update the bit data in the corresponding magnetic domain.

35. The driving method according to claim 32, further comprising:
reading the bit data in one of the magnetic domains during a read/write period by using a read device.

36. The driving method according to claim 32, wherein a frequency of the AC signal is substantially between $10^6$ Hz and $10^9$ Hz.

37. The driving method according to claim 32, wherein a current density of the low current pulse is substantially between $10^6$ amp/cm2 and 107 amp/cm2.

* * * * *